(12) United States Patent
Chih-Hung

(10) Patent No.: US 7,501,809 B2
(45) Date of Patent: Mar. 10, 2009

(54) ELECTRONIC COMPONENT HANDLING AND TESTING APPARATUS AND METHOD FOR ELECTRONIC COMPONENT HANDLING AND TESTING

(75) Inventor: Hsieh Chih-Hung, Hsin-Chu (TW)

(73) Assignee: King Yuan Electronics Co., Ltd., Hsin-Chu (TW)

(*) Notice: Subject to any disclaimer, the term of this patent is extended or adjusted under 35 U.S.C. 154(b) by 0 days.

(21) Appl. No.: 11/652,695

(22) Filed: Jan. 12, 2007

(65) Prior Publication Data
US 2007/0109010 A1 May 17, 2007

Related U.S. Application Data

(63) Continuation-in-part of application No. 11/233,589, filed on Sep. 22, 2005, now abandoned.

(51) Int. Cl.
*G01R 31/28* (2006.01)
(52) U.S. Cl. .................. 324/158.1; 324/765; 414/403
(58) Field of Classification Search ......... 324/324–765; 414/403
See application file for complete search history.

(56) References Cited

U.S. PATENT DOCUMENTS

| | | | |
|---|---|---|---|
| 4,576,326 A * | 3/1986 | Hawrylo ................. 228/171 |
| 5,184,068 A | 2/1993 | Twigg et al. | |
| 5,310,039 A * | 5/1994 | Butera et al. ............. 198/346.2 |
| 5,588,797 A | 12/1996 | Smith | |
| 5,772,387 A * | 6/1998 | Nakamura et al. ..... 414/416.01 |
| 6,024,526 A * | 2/2000 | Slocum et al. ......... 414/226.01 |
| 6,074,158 A | 6/2000 | Yutaka et al. | |
| 6,163,145 A | 12/2000 | Yamada et al. | |
| 6,203,582 B1 | 3/2001 | Berner et al. | |
| 6,259,247 B1 | 7/2001 | Bannai et al. | |
| 6,336,546 B1 | 1/2002 | Lorenz et al. | |
| 6,471,462 B1 | 10/2002 | Lee et al. | |
| 6,670,568 B2 | 12/2003 | Goetzke et al. | |
| 6,847,202 B2 | 1/2005 | Hwang et al. | |

* cited by examiner

*Primary Examiner*—Ha Tran T Nguyen
*Assistant Examiner*—Richard Isla Rodas
(74) *Attorney, Agent, or Firm*—Muncy, Geissler, Olds & Lowe, PLLC

(57) ABSTRACT

The present invention discloses an electronic testing apparatus and a continuous test method for electronic component, which includes multiple test areas, each area possesses respective pick and place module. The apparatus includes multiple shuttles located between the test area and input/output trays. Moreover, a further pick and place module is utilized, between the shuttles and the input/output trays, for picking and placing the devices under test or tested device. The method delivers different electronic component to different test area for testing by different shuttles and to perform testing continuously.

36 Claims, 7 Drawing Sheets

ELECTRONIC COMPONENT HANDLING AND TESTING APPARATUS AND METHOD FOR ELECTRONIC COMPONENT HANDLING AND TESTING

CROSS REFERENCE

This application is a continuation-in-part of U.S. patent application Ser. No. 11/233,589, filed Sep. 22, 2005 now abandoned.

BACKGROUND OF THE INVENTION

1. Field of the Invention

The present invention generally relates to an electronic component test device and the method for electronic component testing, and more particularly to an Integrated Circuit (ICs) test device and the method for ICs testing, which includes a plurality of shuttles having individual pick and place module.

2. Description of the Prior Art

During the packaging process, Integrated circuit (ICs) may be damaged or packaging may not be correctly performed. The failures introduced during packaging typically cause 1 percent or more of ICs to fail. Therefore it is necessary to perform the final test, which fully inspection performed on each packaged IC prior to shipment, in order to satisfy customer's requirement.

FIG. 1 shows the vertical plan view of conventional test apparatus (handler 100). The handler 100 is a piece of equipment that "handles" the ICs and makes connections to an automatic tester (not shown) via connecting cable. The handler can be divided into two zones, the input/output zone is located in the front area of the handler and the test zone is located in the rear area of the handler. There are several input trays 104 and several output trays 105 stacking arrangement in the input/output zone of the handler. The input trays are used to store the ICs, and the output trays are used to grade the tested ICs according to Binning process, which is a process of sorting parts based on some measured performance parameter such as speed of operation or other criteria.

As shown in FIG. 1, the handling of the ICs/tested ICs is fully automated from the input trays 104 to the output trays 105 by using a fast pick and place module 108 based on XY mechanism with linear motors on magnetic suspension technology. The pick and place module 108 can take any positions of the input/output zone by slipping through x-rail 109 and y-rail 108. The pick and place module 108 picks one IC from input tray 104, putting it in the front depression 115a of the shuttle 114, then moving the shuttle 114 from the input/output zone of the handler 100 to the test zone by the way of track 116.

The other pick and place module 112 located in the test zone picks another tested IC (which had completed the final test) from test area 118 by slipping through y-rail 113 and x-rail 111, and then putting it in the rear depression 115b of the shuttle 114, picking the IC that had previously stored in the front depression 115a of the shuttle 114, putting it in the socket 119 of one test area 118, and proceeding to undergo the final test.

While the final test is undergoing, the pick and place module 108 picks the tested IC which had previously stored in the rear depression 115b of the shuttle 114 by way of the track 116, sorting it by grade then putting in the output tray 105.

Although the conventional handler 100 shown in FIG. 1 has multiple test area 118 (six in the FIG. 1), it has only one shuttle 114 and only one pick and place module 112 can pick the IC to undergo the final test. Accordingly, it is usually more than one tested IC in the test area waiting to be picked to the shuttle 114, but it can be picked until the shuttle 114 is back to the test zone from the input/output zone. In the meantime, the IC that had stored in the front depression 115a also cannot be picked into the test area, that is to say, wasting too much time on wait, and consequently tact time of conventional handler is too long, the tact time is the time needed to manufacture/test one unit of a product, measured as the elapsed time between the completion of one unit and the completion of the next. The long tact time cause the yield decreases significantly. Moreover, if the test time of the IC is shorter, then the time during wait will get longer. For example, if the time need to pick and place is 5 seconds, but the time need to complete test one IC is less than 30 seconds such as 10-15 seconds, then the time of stay in test area will become 10 seconds or longer.

The modern semiconductor production test equipment is increasingly complex to design, build and maintain. In order to decreasing the cost and increasing the yield, it is necessary to make full use of the handler 100 and to avoid idle and to increase the quantity of test per unit time, a need has arisen to propose an apparatus and a method for ICs testing, that allows for decreasing the tact time and increasing the yield.

SUMMARY OF THE INVENTION

In view of the foregoing, it is an object of the present invention to provide a test apparatus and a test method for decreasing the probability of tested component stayed in the test area when the final test has finished, and therefore increasing the yield.

In a preferred embodiment, the present invention provides an electronic component testing apparatus, which includes multiple test area and each test area includes individual pick and place module. Furthermore, multiple shuttles are provided, which is moved between the test zone and the input/output zone. In addition, one pick and place module locating in the input/output zone is provided for conveying the ICs or the tested ICs. Besides, the present invention provides a continuous test method for electronic component, which include follow steps: (a) providing at least one input tray and at least one output tray; (b) picking up the first electronic component stored in the input tray and place module and placing it in a shuttle; (c) carrying the first electronic component to first test area; (d) picking up first electronic component form the first shuttle and placing it in the first test area; (e) testing the first electronic component; (f) picking up the first tested electronic component form the first test area and placing it in the first shuttle; (g) carrying the first tested electronic component back; (h) picking up the first tested electronic component form said shuttle and placing it in one of the output trays base on test data of said tested electronic component by said I/O-pick and place module; (i) repeating said steps (b)-(i); and repeating (b)-(i) for carrying the second electronic component stored in the input tray to the second test area by the second shutter and the second test-pick and place module and to be test by the second test area after the electronic component finishes said step (b). Thus, the second electronic component, the third electronic component and so on can be test after the first electronic component is testing and the test apparatus will not be idle.

DESCRIPTION OF THE PREFERRED EMBODIMENT

The detailed description of the present invention will be discussed in the following embodiment, which is not intended to limit the scope of the present invention, but can be adapted for other applications. While drawings are illustrated in details, it is appreciated that the quantity of the disclosed components may be greater or less than that disclosed, except expressly restricting the amount of the components.

Figure 1:
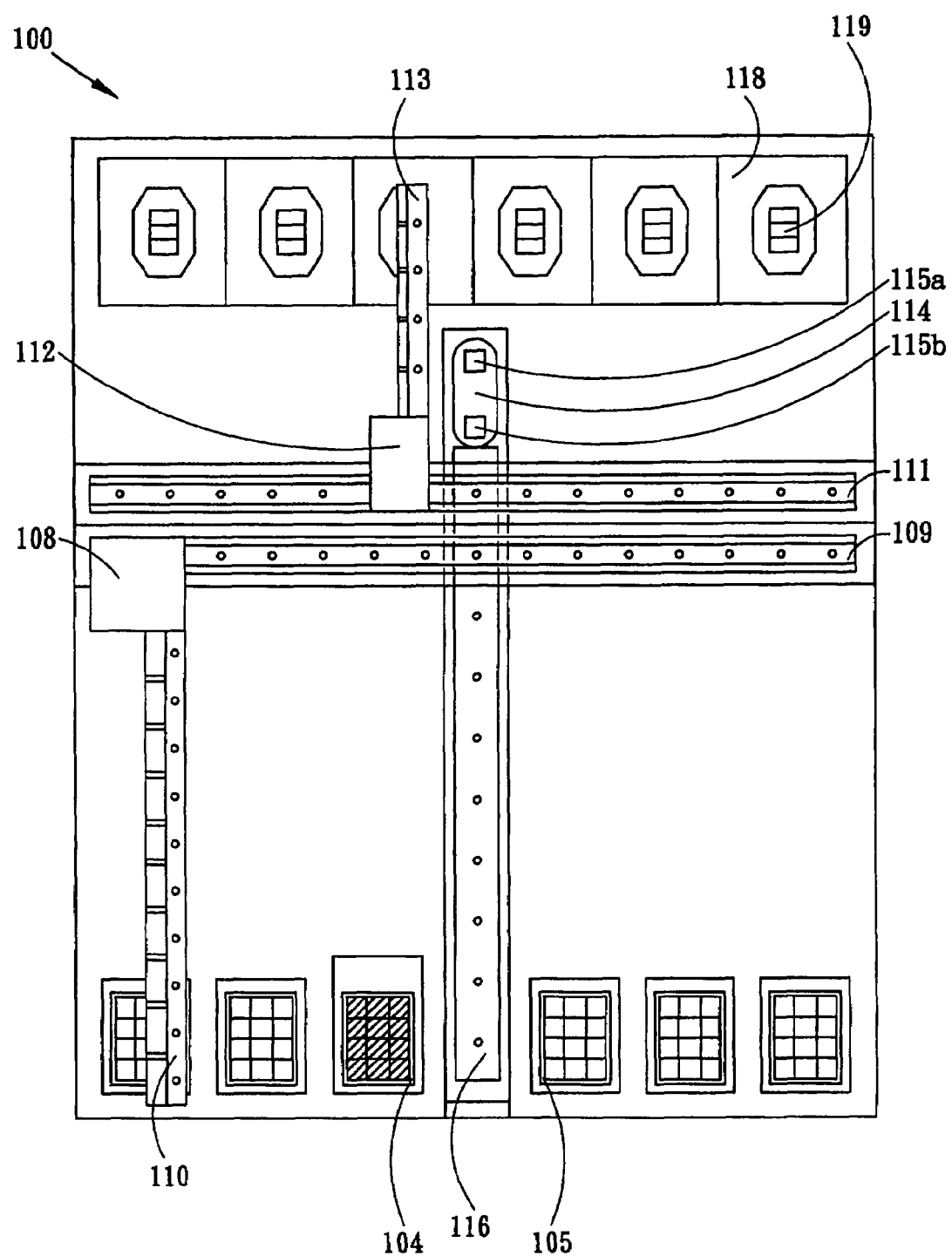
FIG. 1 shows the vertical plan view of conventional ICs test apparatus (handler).
Figure 2:
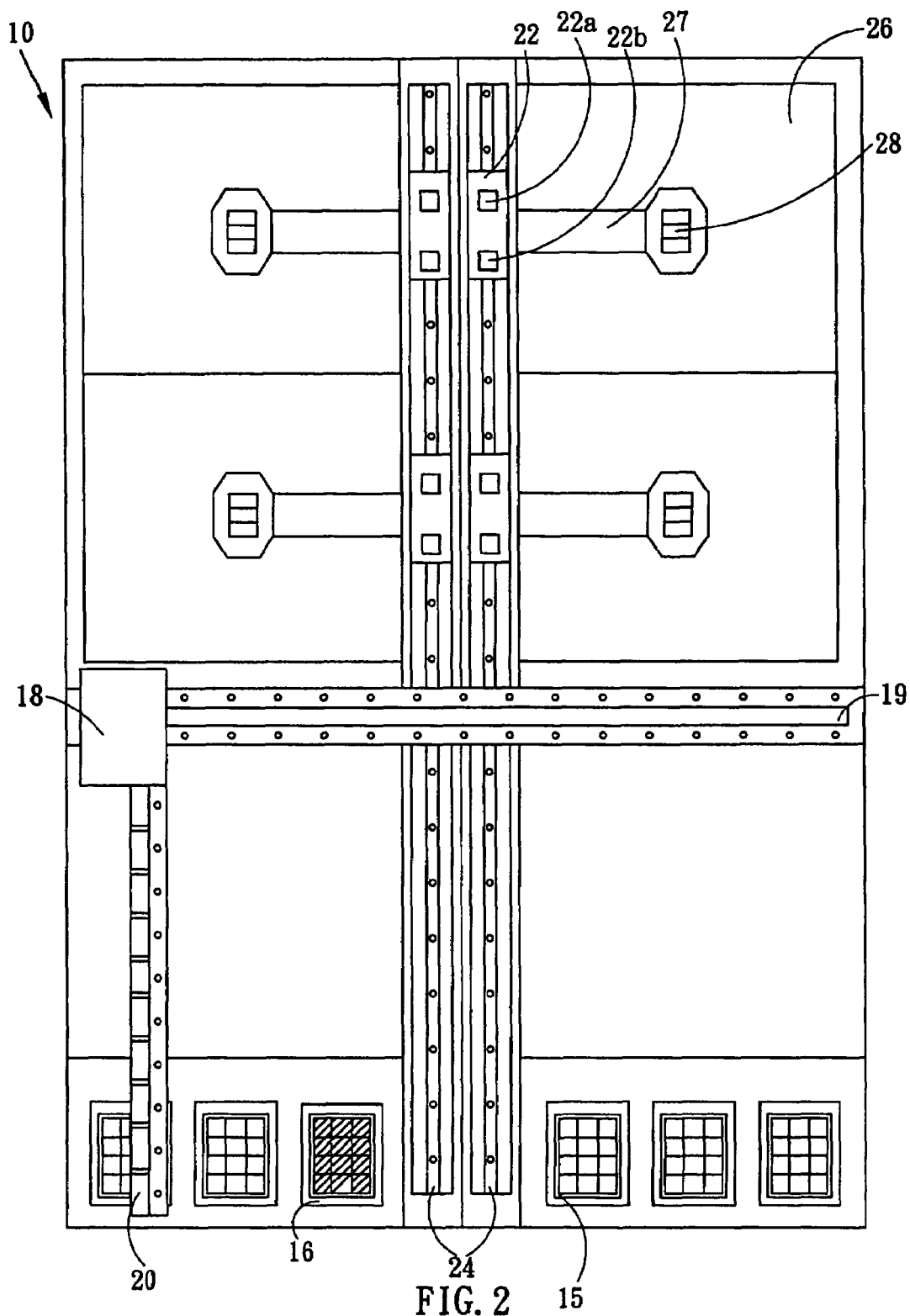
FIG. 2 shows the vertical plan view of ICs test apparatus according to one embodiment of the present invention.

FIG. 2 shows the vertical plan view of ICs test apparatus according to one embodiment of the present invention. Pluralities of input trays 16 for storing the ICs are stacking arrangements in the input/output zone of the handler 10. Each of the input trays 16 with a plurality of IC aligned thereon. Similar to input trays 16, there is also at least one output tray 15 located within the input/output zone for storing the tested IC. The tested ICs are graded to output trays 15 according to measured parameter. The number of input/output trays 16/15 and their location can be adjusted according to actual requirement.

Several test areas 26 are provided in the test zone of the handler 10, it has four aligning in two columns in this embodiment. Either of the number of test area 26 or the way of aligned could be changed in other embodiment according to present invention. A socket 28 is provided in each test area 26, it is used to connect the IC and the automatic test system (not shown) for undergoing a final test. In addition, a test-pick and place module 27 is located in each test area 26 for picking the tested IC from the socket 28, or placing the IC in the socket 26. Furthermore, the test-pick and place module 27 having contact mechanism is employed for pressing and retaining the IC even providing heat to the IC while the final test is undergoing. In this embodiment, the socket 28 is connected to real system such as motherboard or CD-ROM drive. However, the socket can also be connected to non-real system, for such case, the socket 28 will be connected to the test head of non-real system.

As shown in the FIG. 2, the handler 10 has multiple (four in this embodiment) shuttles 22, and the shuttle has front depression 22a and rear depression 22b on it, which is used to store the IC and the tested IC respectively. The shuttles 22 carry the IC from the input/output zone to the test zone, or carry the tested IC from the test zone to the input/output zone by slipping through several tracks 24 (two in this embodiment), furthermore, the track 24 is capable of carrying more than one shuttle on it in the meantime.

A I/O-pick and place module 18 locating in the input/output zone of the handler 10 is used for picking one piece of IC from the input tray, and then placing it in the front depression 22a of the shuttle 22; or picking one piece of tested IC from the rear depression 22b of the shuttle 22, and then placing it in the different graded output trays according to the test result. There are a X-rail 19 and a Y-rail 20 for moving the I/O-pick and place module 18 in X-direction and Y-direction.

The sequence of whole testing process is becoming simpler, clearer and sooner than before, now describing as following: The I/O-pick and place module 18 picks one piece of IC form the input tray 16, and then placing it in the front depression 22a of the shuttle 22. After that, the shuttle 22 moves to the test zone by way of track 24. Then the test-pick and place module 27 picks this IC and placing it into socket 28 to undergo the final test. According the present invention, because the handler 10 has multiple shuttles and multiple tracks, so that the shuttles 22 are capable of moving the IC to the test zone on request immediately, without waiting the shuttles 22 back to input/output zone. It is the same reason the tested ICs can be carried to the input/output zone without waiting the shuttles 22 back to test zone. According to this embodiment of the present invention, it has decreased the waiting time of the tested IC significantly as well as makes full use of the test apparatus, consequently increasing the yield.

Figure 3A:
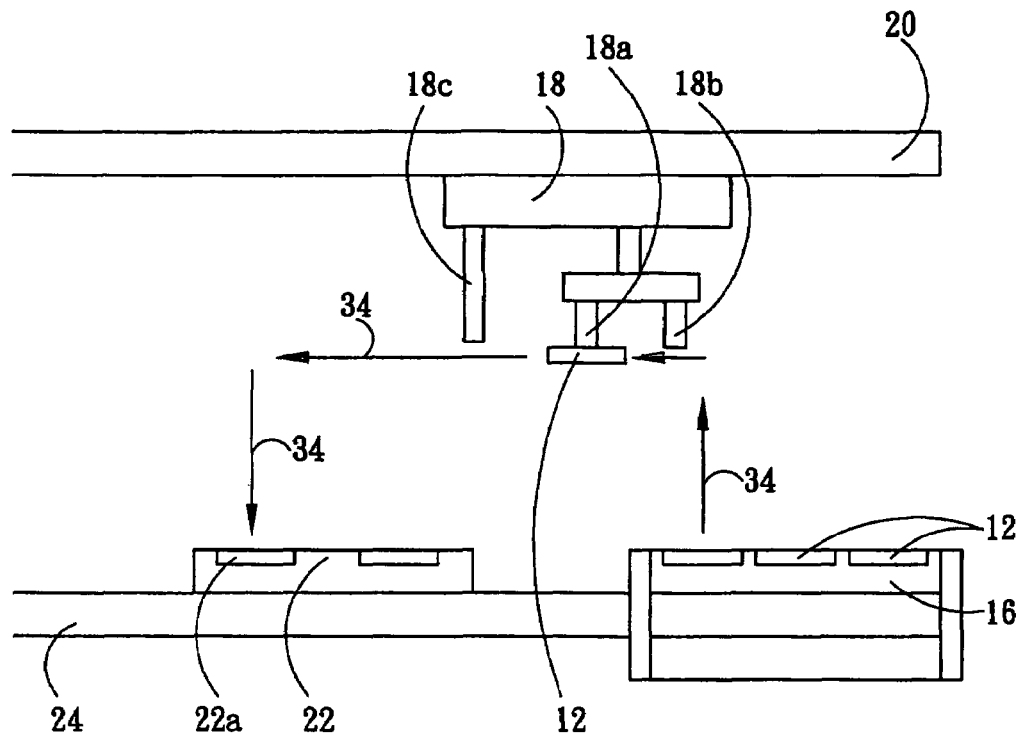
FIG. 3A and FIG. 3B illustrate two diagrams of IC/tested IC being picked/placed by the I/O pick and place module of present invention.
Figure 3B:
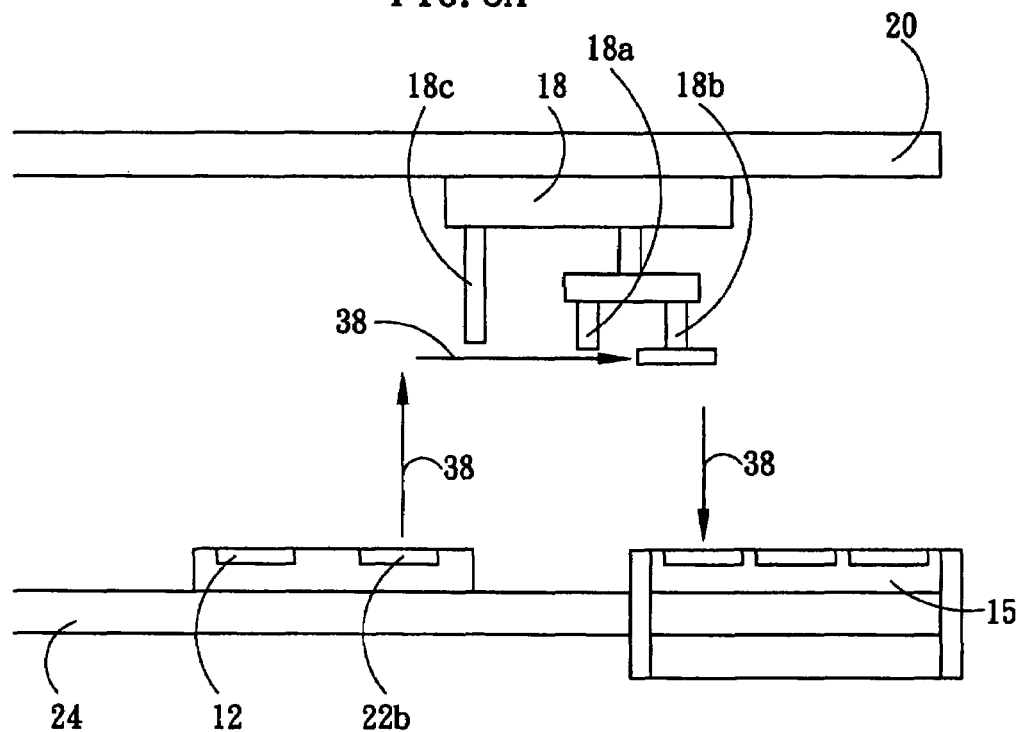

FIG. 3A and FIG. 3B illustrate two diagrams of IC/tested IC being picked/placed by the I/O-pick and place module 18 of present invention. The I/O-pick and place module 18 locating in the input/output zone includes input suction head 18a, output suction head 18b, and tray picker 18c. FIG. 3A shows the image of sucking the IC 12. The input suction head 18a aims at the input tray 16 then sucking the IC 12 form it, following the direction 34 then putting the IC 12 in the front depression 22a of the shuttle 22. Moreover, the input suction head 18a is capable of reversing the IC 12 if there is a need before it is put into the front depression 22a. FIG. 3B shows the image of placing the IC 12. The output suction head 18b aims at the rear depression 22b then sucking the IC 12 form it, following the direction 38 then putting the IC 12 in the output tray 15. Moreover, the output suction head 18b is capable of reversing the IC 12 if there is a need before it is put into the rear depression 22b.

Figure 4:
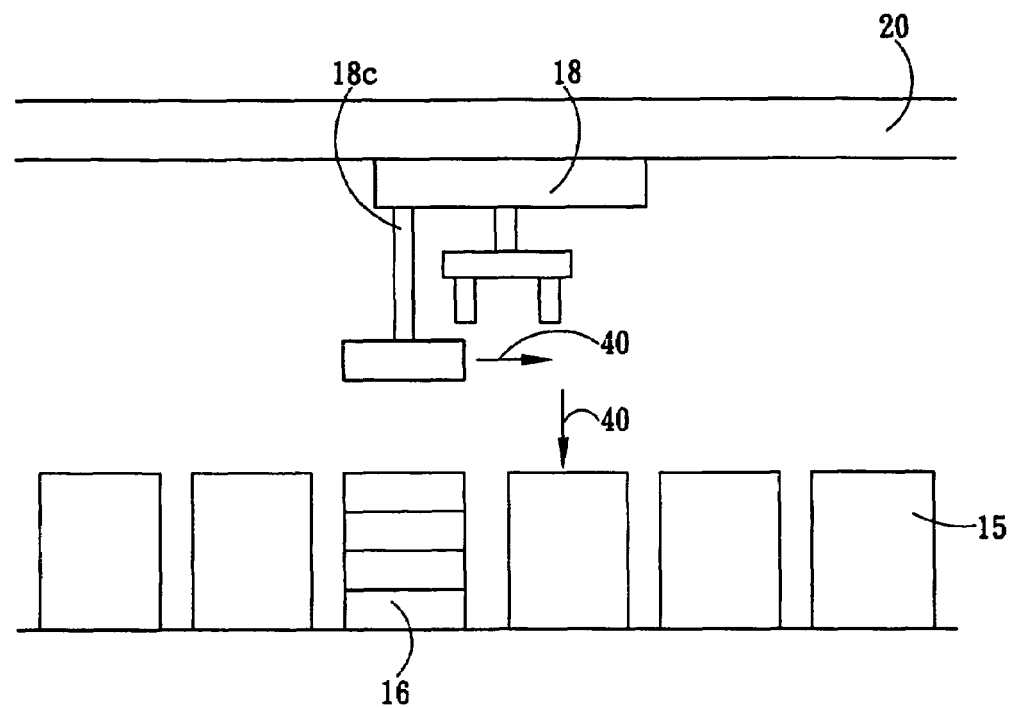
FIG. 4 show a front side view taken on the front side of the handler according to one embodiment of the present invention.

FIG. 4 shows a side view taken on the front side of the handler 10. When all of the ICs in the top of a stack of input trays 16 have picked and becoming empty, the empty input tray 16 will be moved away by the tray picker 18c following the direction of 40, or moving to the output zone as the output tray 15. The location of the empty input tray 16 will be replaced by raising the input tray under it while the empty input tray is picking by tray picker 18c. Again, the ICs could be picked from the input tray 16 which had risen previously.

Figure 5:
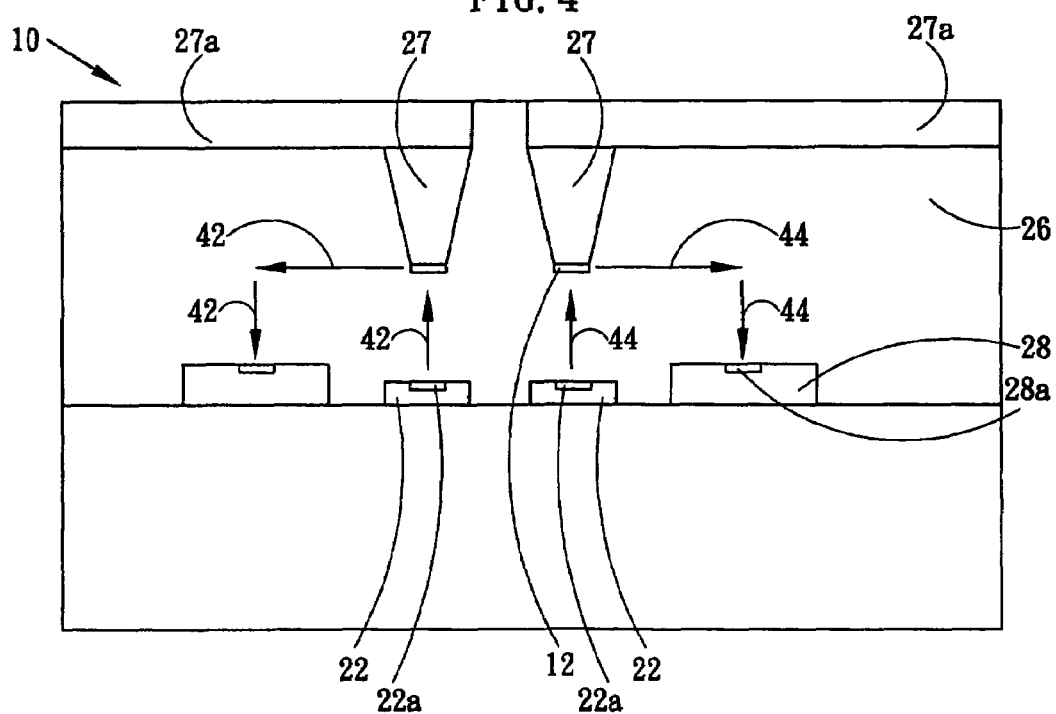
FIG. 5 show a rear side view taken on the rear side of the handler according to one embodiment of the present invention.

FIG. 5 shows a side view taken on the rear side of the handler 10. After the IC 12 has moved to one test area 26 of the test zone, the test-pick and place module 27 picks the IC 12 and placing it into the socket 28 following the direction of 42, and then proceeding to undergo the final test. The contact mechanism of the test-pick and place module 27 will press and retain the IC 12 until the final test is finished. After the final test has done, the test-pick and place module 27 will pick the tested IC 12 from the socket 28, and then putting it into the rear depression 22b following in the opposite direction of 42. As show in the right section of figure 5, similar to the left section of FIG. 5, the IC 12 follow in the direction of 44 to undergo the final test, and the IC 12 follow in the opposite direction of 44 to store the tested IC in the shuttle 22 when the final test has finished.

Figure 6:
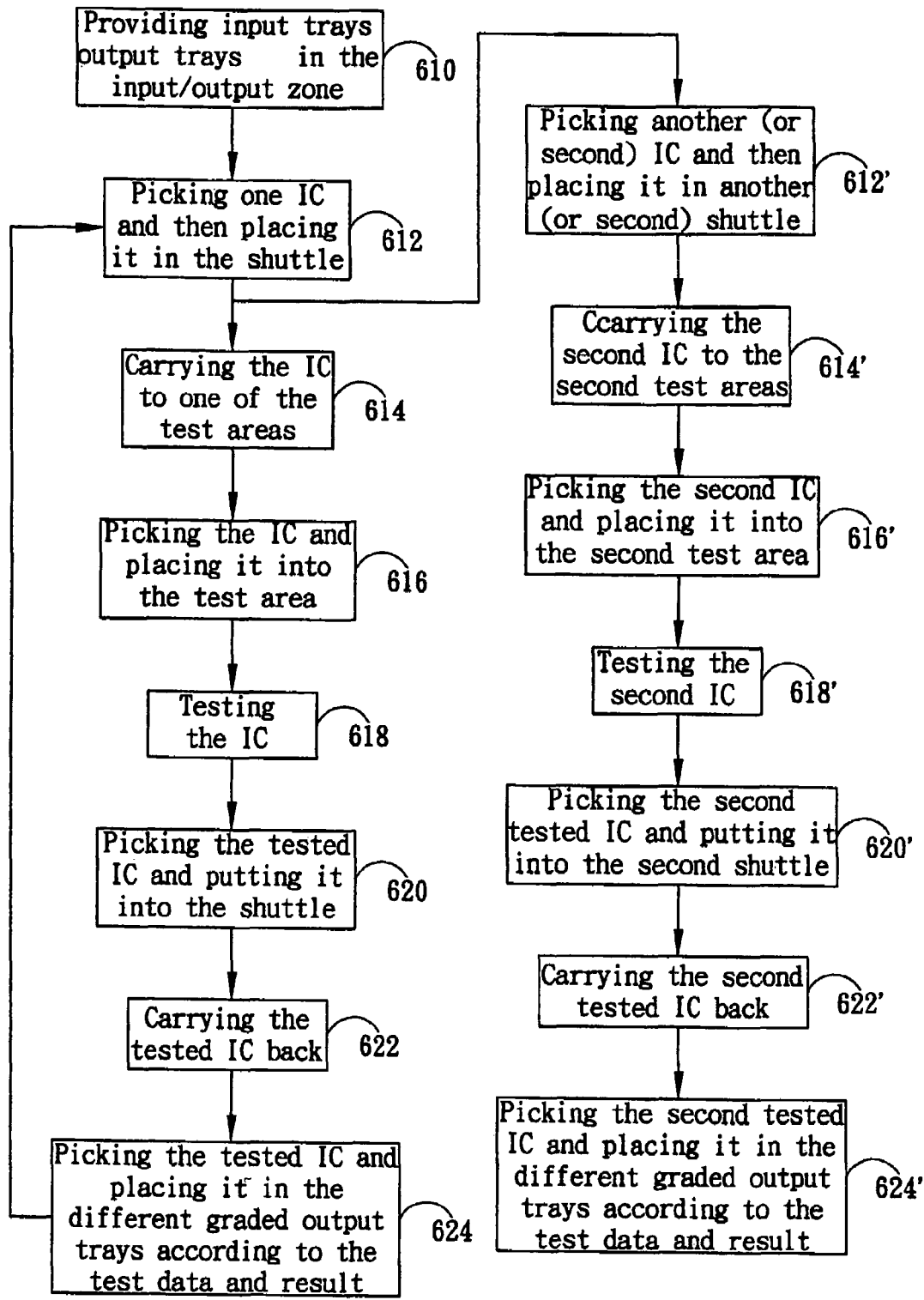
FIG. 6~8 show the follow chart of the continuous test method of the present invention.

FIG. 6 shows the follow chart of the continuous test method of the present invention. First, as FIG. 2 and FIG. 6 show, providing pluralities of input trays 16 for storing the ICs in the input/output zone of the handler 10 wherein pluralities of input trays are stacked, and provided at least one output trays 15 in the input/output zone (step 610). Next, as FIG. 3A and FIG. 6 show, picking one piece of IC form the input tray 16, and then placing it in the front depression 22a of the shuttle 22 (step 612) by the I/O-pick and place module 18. Then, carrying the IC form the input/output zone of the handler 10 to one of the test areas 26 by moving the shuttle 22 (step 614). After that, as FIG. 5 and FIG. 6 show, picking the IC and placing it into the socket 28 of the test area 26 by the test-pick and place module 27 of the test area 26 (step 616), and then testing the IC and get the test data of the IC (step 618). In the present invention, each of the test areas 26 has a test-pick and place module 27. During the test, the test-pick and place module 27 will press and retain the IC 12 until the final test is finished. After the test has done, picking the tested IC from the socket 28, and then putting it into the rear depression 22b of shuttle 22 by the test-pick and place module (step 620). And then, moving the shuttle 22 to carry the tested IC back to the input/output zone (step 622). After that, picking the tested IC from the rear depression 22b of the shuttle 22, and then placing it in the different graded output trays according to the test data and result (step 624). And then, repeating the steps 612-624 until all ICs finish the test. In the embodiment showed in FIG. 2, there are several shuttles 22 on same track 24, and the shuttles 22 are moved together to prevent the shuttles 22 from colliding with each other. Besides, the shuttles 22 on the same track 24 are moved together after the ICs are placed on the shuttles 24.

Besides, after the picking first IC form the input tray 16 and placing it in the front depression 22a of the shuttle 22 (step 612), the I/O-pick and place module 18 is not idle. As FIG. 6 shows, another IC or second IC stored in the input tray 16 is picked form the input tray 16, and then placing it in the front depression 22a of the second shuttle 22 (step 612') by the I/O-pick and place module 18. Next, the second IC is carried form the input/output zone of the handler 10 to the second test area 26 by moving the second shuttle 22 (step 614'). After that, the second IC is picked and it is placed into the socket 28 of the second test area 26 by the second test-pick and place module 27 of the second test area 26 (step 616'), and then testing the second IC and get the test data of the second IC (step 618'). The second test-pick and place module 27 will press and retain the IC 12 until the final test is finished. After the test has done, the second tested IC is picked from the socket 28, and then it is put into the rear depression 22b of the second shuttle 22 by the second test-pick and place module (step 620'). And then, moving the second shuttle 22 to carry the second tested IC back to the input/output zone (step 622'). After that, the second tested IC is picked from the rear depression 22b of the second shuttle 22, and then it is placed in the different graded output trays according to the test data and result (step 624'). And then, before repeating the steps 612-624, repeating the step 612'-624' to carry the other ICs form the input tray 16 to the other test areas 26 which empty of finished the test to be tested when the I/O-pick and place module 18 is idle. Thus, the test apparatus will not idle and the IC test is continuous until all ICs have been tested. The method for IC test decreases the idle time of the test apparatus in order to increase the yield and to perform continuous IC test.

Figure 7:
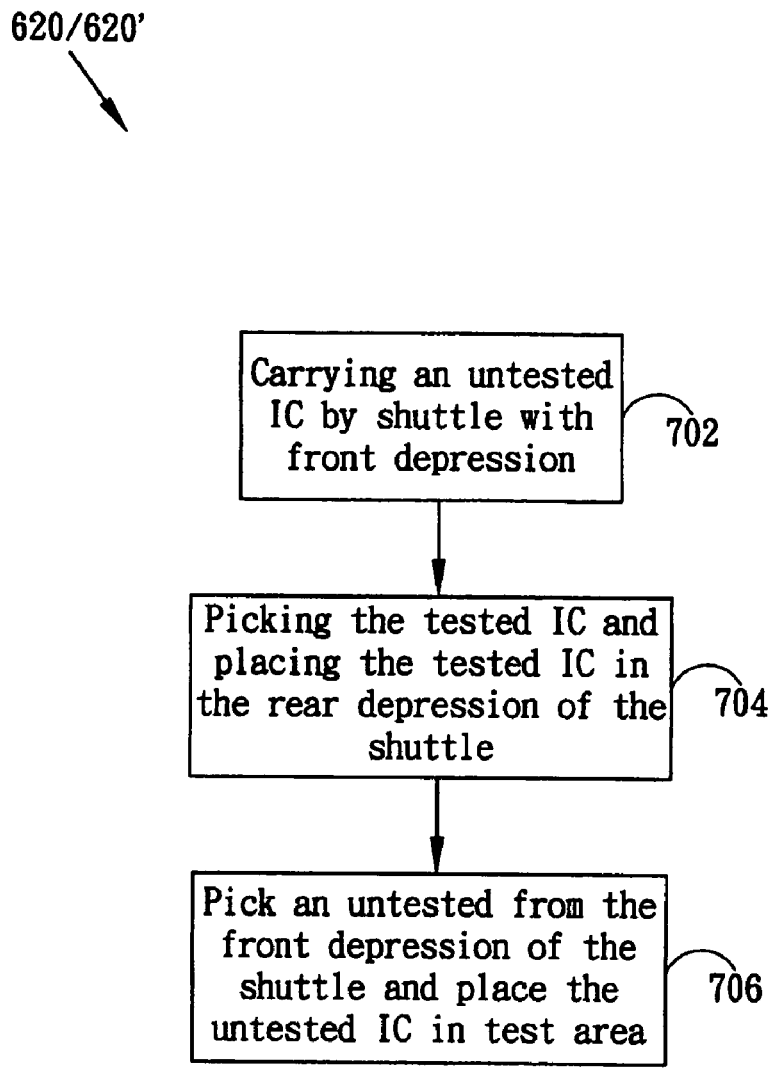
Figure 8:
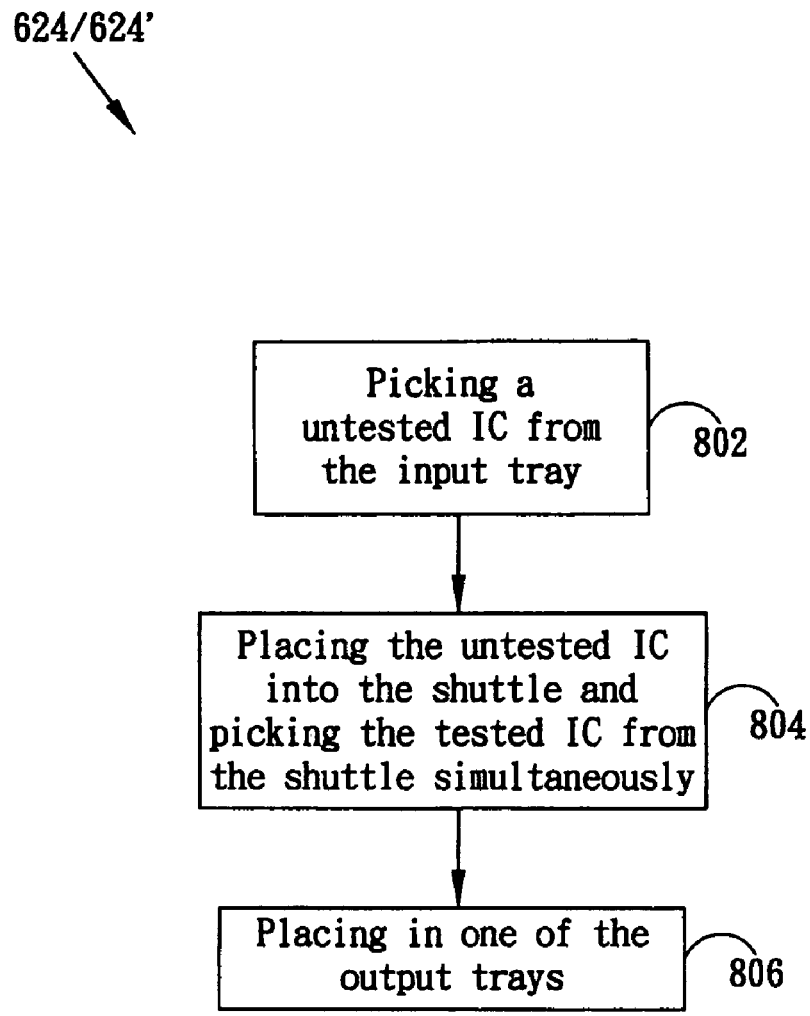

FIG. 7 shows the detail flow chart of the step 620 and 620'. First, when the test of the first IC is proceeding, another untested IC is picked from the input tray and placed in the front depression of the shuttle by I/O-pick and place module, and then the shuttle carries the untested IC to the test area with it's front depression of the shuttle (step 702). And then, the test-pick and place module picks the tested IC to transfers the tested IC to the shuttle, and places the tested IC in the rear depression of the shuttle (step 704). Finally, the test-pick and place module picks the untested IC from the front depression of the shuttle and places the untested IC to the test area for testing (step 706). Each of the test areas have it's own test-pick and place module and shuttle and the time for transferring IC and waiting can be reduce by this.

FIG. 7 shows the detail flow chart of the step 624 and 624'. First, still another untested IC is picked from the input tray by the I/O-pick and place module (step 802). And then, the I/O-pick and place module places the untested IC into the front depression of the shuttle and picks the tested IC from the rear depression of the shuttle at the same time (step 804). Finally, the tested IC is placed in one of the output trays base on it's test result and the shuttle carry the untested IC to the test area for testing (step 806). In the method of the present invention the untested IC and the tested IC are simultaneously transferred between the shuttle and the trays by the I/O-pick and place module. Therefore, neither the transport of the untested IC nor the transport of the untested IC does not need to wait, and the time for transferring IC will be reduced.

In addition, after All ICs in the uppest input tray finish the final test or the uppest input tray is empty, the I/O-pick and place module 18 will pick the uppest input tray, and then it is placed to other position of the input/output zone to be a out tray. And then the second input tray below the uppest input tray in the stack of the input trays will be a another uppest input tray and the test continuous. Besides, before the I/O-pick and place module places IC in shuttle, input tray or output tray, the IC can be reversed as desired by the I/O-pick and place module.

Although specific embodiments have been illustrated and described, it will be appreciated by those skilled in the art that various modifications may be made without departing from the scope of the present invention, which is intended to be limited solely by the appended claims.

What is claimed is:

1. An electronic component test apparatus, comprising:
   at least one input trays for storing an electronic component prior to proceeding a test;
   at least one output trays for storing a tested electronic component;
   a plurality of test areas for testing the electronic component;
   a plurality of test-pick and place module for picking or placing the tested electronic component or the electronic component wherein each of said a plurality of test areas has one said test-pick and place module, and said test-pick and place module have contact mechanism employed for pressing said electronic component and provide heat to said electronic component in testing time;
   a plurality of shuttles moving between said test areas and said input trays or said output trays for carrying the electronic component or tested electronic component, wherein each of said a plurality of shuttles is corresponded only one of said test areas and only carries the electronic component or tested electronic component into or out the corresponded test area;
   a plurality of tracks for moving said shuttles, wherein each of said a plurality of tracks moving several said shuttles at the same time; and
   a I/O-pick and place module for picking or placing the electronic component between said input tray, said output tray and said shuttles, wherein said I/O-pick and place module has an input suction head for sucking the electronic component to pick and place the electronic component and rotating the electronic component according to requirement, an output suction head for sucking the tested electronic component to pick and place the tested electronic component and rotating the tested electronic component according to requirement and a tray picker for picking said input tray or said output tray.

2. The electronic component test apparatus as set forth in claim 1, wherein said test area further comprises a socket for setting the electronic component prior to undergo the test.

3. The electronic component test apparatus as set forth in claim 1, wherein said shuttles include a front depression and a rear depression for storing the electronic component and the tested electronic component respectively.

4. The electronic component test apparatus as set forth in claim 1, further comprising a Y-rail for moving said I/O-pick and place module in Y-direction.

5. The electronic component test apparatus as set forth in claim 1, further comprising a X-rail for moving said I/O-pick and place module in X-direction.

6. An continuous test method for electronic component by an electronic component test apparatus which comprises a input/output zone, a plurality of test areas, a plurality of shuttles, a plurality of test-pick and place modules and an I/O-pick and place module having an input suction head, an output suction head and a tray picker, comprising:

(a) providing at least one input tray to said input/output zone and providing at least one output tray to said input/output zone;

(b) transferring a electronic component stored in said input tray to said shuttle and carrying said electronic component to a test area by said shuttle;

(c) transferring said electronic component to said test area and testing said electronic component by said test area;

(d) transferring said tested electronic component from said test area to said shuttle and carrying said electronic component to said input/output zone by said shuttle;

(e) gathering said tested electronic component in said output tray based on test result of said tested electronic component;

(f) repeating said steps (b)-(f) for next electronic component stored in said input tray until all electronic components stored in said input tray are tested without using the other shuttles and the other test areas; and repeating (b)-(f) for carrying another electronic component stored in said input tray to another test area by a second shuttle and a second test-pick and place module and testing said another electronic component after said electronic component finishes said step (b), wherein each of said a plurality of shuttles is corresponded only one of said test areas and only carries the electronic component or tested electronic component into or out the corresponded test area.

7. The continuous test method for electronic component as set forth in claim 6, further comprising providing a plurality of input trays and stacking said plurality of input trays.

8. The continuous test method for electronic component as set forth in claim 6, further comprising providing a plurality of output trays and stacking said plurality of output trays.

9. The electronic component test apparatus as set forth in claim 6, wherein said shuttles include a front depression and a rear depression for storing the electronic component and the tested electronic component respectively.

10. The continuous test method for electronic component as set forth in claim 6, wherein said step (b) further comprises picking up a electronic component stored in said input tray by a I/O-pick and place module and placing said electronic component in a shuttle by said I/O-pick and place module.

11. The continuous test method for electronic component as set forth in claim 6, wherein said step (b) further comprises carrying said electronic component to a test area by said shuttle.

12. The continuous test method for electronic component as set forth in claim 11, further comprising rotating said electronic component after said step of picking up said electronic component stored in said input tray by a I/O-pick and place module and before said step of placing said electronic component in a shuttle by said I/O-pick and place module.

13. The continuous test method for electronic component as set forth in claim 6, wherein said step (c) further comprises picking up said electronic component form said shuttle and placing said electronic component in a test area by a test-pick and place module of said test area.

14. The continuous test method for electronic component as set forth in claim 6, wherein said step (c) further comprising pressing and retaining said electronic component until the test has finished.

15. The continuous test method for electronic component as set forth in claim 6, wherein said step (d) further comprises picking up an untested electronic component form said input tray, placing said untested electronic component to said front depression of said shuttle by said I/O-pick and place module, and carrying said untested electronic component to said test area by said shuttle.

16. The continuous test method for electronic component as set forth in claim 15, further comprises picking up said tested electronic component form said test area and placing said tested electronic component in said shuttle by said test-pick and place module.

17. The continuous test method for electronic component as set forth in claim 16, further comprises picking up said untested electronic component form said front depression of said shuttle and placing said untested electronic component in said test area by said test-pick and place module.

18. The continuous test method for electronic component as set forth in claim 6, wherein said step (d) further comprises carrying said tested electronic component back by said shuttle.

19. The continuous test method for electronic component as set forth in claim 6, wherein said step (e) further comprises picking up another untested electronic component form said input tray and placing said another untested electronic component to said front depression of said shuttle by said I/O-pick and place module.

20. The continuous test method for electronic component as set forth in claim 19, wherein said step (e) further comprises picking up said tested electronic component form said shuttle and placing said tested electronic component in said output tray based on test result of said tested electronic component by said I/O-pick and place module.

21. The continuous test method for electronic component as set forth in claim 20, wherein said step of placing said another untested electronic component in said front depression of said shuttle is proceeded by said input suction head of said I/O-pick and place module and said step of picking up said tested electronic component form said rear depression of said shuttle is performed by said output suction head of said I/O-pick and place module at the same time.

22. The continuous test method for electronic component as set forth in claim 20, further comprising rotating said tested electronic component after said step of picking up said tested electronic component form said shuttle by said I/O-pick and place module and before said step of placing said tested electronic component in said output tray based on test result of said tested electronic component by said I/O-pick and place module.

23. The continuous test method for electronic component as set forth in claim 6, further comprising picking up a input tray wherein all said electronic component stored in said input tray finish testing from said input zone and placing said input tray to said output zone.

24. An continuous test method for electronic component by an electronic component test apparatus which comprises a I/O-pick and place module having an input suction head, an output suction head and a tray picker, a plurality of test areas, a plurality of shuttles and a plurality of test-pick and place modules wherein each of said plurality of shuttles of test-pick and place module corresponding to one of said plurality of test areas, comprising:
   (a) providing at least one input tray to input/output zone and providing at least one output tray to input/output zone;
   (b) picking up a electronic component stored in said input tray by said I/O-pick and place module and placing said electronic component in one of said plurality of shuttle by said I/O-pick and place module;
   (c) carrying said electronic component to one of said plurality of test area by said shuttle;
   (d) picking up said electronic component form said shuttle and placing said electronic component in said test area by said test-pick and place module of said test area;
   (e) testing said electronic component by said test area;
   (f) picking up said tested electronic component form said test area and placing said tested electronic component in said shuttle by said test-pick and place module;
   (g) carrying said tested electronic component back by said shuttle;
   (h) picking up said tested electronic component form said shuttle and placing said tested electronic component in said output tray based on test result of said tested electronic component by said I/O-pick and place module;
   (i) repeating said steps (b)-(i)for next electronic component stored in said input tray until all electronic components stored in said input tray are tested without using the other shuttles and the other test areas; and
   repeating (b)-(i) for carrying another electronic component stored in said input tray to another test area by a second shuttle and a second test-pick and place module and testing said another electronic component after said electronic component finishes said step (b),wherein each of said a plurality of shuttles is corresponded only one of said test areas and only carries the electronic component or tested electronic component into or out the corresponded test area.

25. The continuous test method for electronic component as set forth in claim 24, further comprising providing a plurality of input trays and stacking said plurality of input trays.

26. The continuous test method for electronic component as set forth in claim 24, further comprising providing a plurality of output trays and stacking said plurality of output trays.

27. The continuous test method for electronic component as set forth in claim 24, further comprising rotating said electronic component after said step of picking up said electronic component stored in said input tray by a I/O-pick and place module and before said step of placing said electronic component in a shuttle by said I/O-pick and place module.

28. The continuous test method for electronic component as set forth in claim 24, further comprising rotating said tested electronic component after said step of picking up said tested electronic component form said shuttle by said I/O-pick and place module and before said step of placing said tested electronic component in said output tray based on test result of said tested electronic component by said I/O-pick and place module.

29. The continuous test method for electronic component as set forth in claim 24, wherein said shuttles include a front depression and a rear depression for storing the electronic component and the tested electronic component respectively.

30. The continuous test method for electronic component as set forth in claim 29, wherein said electronic component is placed into said front depression of said shuttle in said step (b).

31. The continuous test method for electronic component as set forth in claim 29, wherein said tested electronic component is placed into said rear depression of said shuttle in said step (f).

32. The continuous test method for electronic component as set forth in claim 31, wherein said step (f) further comprises picking up an untested electronic component form said input tray, placing said untested electronic component to said front depression of said shuttle by said I/O-pick and place module, and carrying said untested electronic component to said test area by said shuttle.

33. The continuous test method for electronic component as set forth in claim 32, wherein in said step (f) further comprises picking up said untested electronic component form said front depression of said shuttle and placing said untested electronic component in said test area by said test-pick and place module.

34. The continuous test method for electronic component as set forth in claim 29, wherein said step (h) further comprises picking up another untested electronic component form said input tray and placing said another untested electronic component to said front depression of said shuttle by said I/O-pick and place module.

35. The continuous test method for electronic component as set forth in claim 34, wherein said step of placing said another untested electronic component in said front depression of said shuttle is proceeded by said input suction head of said I/O-pick and place module and said step of picking up said tested electronic component form said rear depression of said shuttle is performed by said output suction head of said I/O-pick and place module at the same time.

36. The continuous test method for electronic component as set forth in claim 24, wherein said step (e) further comprising pressing and retaining said electronic component until the test has finished.

* * * * *